US007250891B2

(12) United States Patent
Nishimura

(10) Patent No.: US 7,250,891 B2
(45) Date of Patent: Jul. 31, 2007

(54) GRAY SCALE VOLTAGE GENERATING CIRCUIT

(75) Inventor: Kouichi Nishimura, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/352,296

(22) Filed: Feb. 13, 2006

(65) Prior Publication Data

US 2006/0192695 A1 Aug. 31, 2006

(30) Foreign Application Priority Data

Feb. 25, 2005 (JP) ............................ 2005-051600

(51) Int. Cl.
*H03M 1/78* (2006.01)
*G09G 3/36* (2006.01)

(52) U.S. Cl. .......................... 341/154; 341/98; 341/97; 345/87; 345/89; 345/98

(58) Field of Classification Search .................. 341/97, 341/98, 154; 345/87–89, 98
See application file for complete search history.

(56) References Cited

U.S. PATENT DOCUMENTS 6,373,478 B1 * 4/2002 Steffensmeier .............. 345/204
6,535,189 B1 * 3/2003 Akiyama et al. ............. 345/87
6,570,560 B2 * 5/2003 Hashimoto .................. 345/211
6,731,259 B2 * 5/2004 Yer et al. ....................... 345/89
6,750,839 B1 * 6/2004 Hogan ......................... 345/98
6,850,085 B2 * 2/2005 Sakaguchi et al. .......... 324/765
6,950,045 B2 * 9/2005 Kim ........................... 341/118
7,023,458 B2 * 4/2006 Kudo et al. ................. 345/690
2002/0149607 A1 * 10/2002 Ito ............................ 345/690
2002/0186231 A1 * 12/2002 Kudo et al. ................. 345/690
2006/0049868 A1 * 3/2006 Yeh ........................... 327/538
2006/0192695 A1 * 8/2006 Nishimura ................... 341/51

FOREIGN PATENT DOCUMENTS

JP 6-348235 12/1994
JP 10-142582 5/1998

* cited by examiner

*Primary Examiner*—Linh Nguyen
(74) *Attorney, Agent, or Firm*—Young & Thompson

(57) ABSTRACT

A gray scale voltage generating circuit includes a first resistor ladder circuit, connected between a high voltage power supply terminal and a low voltage power supply terminal and having nodes for outputting respective reference voltages, a second resistor ladder circuit, connected between the high voltage power supply terminal and the low voltage power supply terminal, and plural voltage follower circuits, connected between the respective nodes of the second resistor ladder circuit and the respective nodes of the first resistor ladder circuit with first resistor provided between the n/2'th node voltage and the high voltage power supply terminal and a second resistor provided between the n/2+1'th node voltage and the low voltage power supply terminal.

9 Claims, 8 Drawing Sheets

GRAY SCALE VOLTAGE GENERATING CIRCUIT

FIELD OF THE INVENTION

This invention relates to a display apparatus and, more particularly, to a gray scale voltage generating circuit for a liquid crystal display device.

BACKGROUND OF THE INVENTION

In color liquid crystal display devices, the number of gray-scale levels to be displayed has been increasing in recent years. For example, the display device of 260 thousand colors by six bits is now being replaced with that of six million seven hundred thousand colors by eight bits. Even a display device capable of displaying ten billion colors by 10 bits is now on the market. Under these circumstances, the gray scale power supply is one of critical fundamental circuits which generate voltage adjusted to the characteristic of each particular liquid crystal panel.

In general, a six-bit product has five positive side amplifiers and five negative side amplifiers, whilst an eight bit product has nine positive side amplifiers and nine negative side amplifiers. These amplifiers are designed to achieve the power supply efficiency and are able to output the voltage up to the vicinity of the power supply voltage or up to the vicinity of the GND (ground) voltage.

Although the wide spread use is made of a dedicated IC of the gray scale power supply, there is a case wherein the gray scale power supply is provided in an LCD driver. In this case, since an amplifier needs to be composed by a CMOS, the margin of driving capability has not sufficient margin, and hence circuit-design skills and techniques are required.

Referring to FIG. 5, there is shown a conventional typical LCD source driver including a data register 1 for sampling 6-bit digital display signals R, G and B, a latch circuit 2 for latching 6-bit digital signals in synchronization with a strobe signal ST, a D/A converter 3 which is made up by N pieces of digital-to-analog converters connected in parallel, a liquid crystal gray scale voltage generating circuit 4 which has a gamma-conversion characteristic adjusted to the liquid crystal characteristic, and N voltage followers 5 for buffering the voltage from the D/A converter 3.

An LCD panel includes a plurality of thin film transistors (TFTs) 6 and a plurality of pixel capacitors 7. Each thin film transistor is provided at an intersection of a data line and a scanning line and has a gate and a source connected to the scanning line and to the data line, respectively, and each pixel capacitor has its one terminal and its other terminal connected to the drain of the associated TFT and to a COM terminal, respectively. In FIG. 5, the configuration for one row of the LCD panel is schematically shown. That is, the LCD panel includes, in actuality, a plural number of rows (M rows), each made up of N thin film transistors (TFTs). An LCD gate driver, not shown, sequentially drives gates of the TFTs in the respective lines. The D/A converter 3 D/A converts the 6-bit digital display signals output from the latch circuit 2 to analog signals to supply the resulting analog signals to the inputs of the N voltage followers 5-1 to 5-N. The output signals from the voltage followers 5-1 to 5-N are supplied through the TFTs 6-1 to 6-N, respectively, to liquid crystal elements, operating as pixel capacitors 7-1 to 7-N, respectively.

The liquid crystal gray scale voltage generating circuit 4 generates a plurality of reference voltages. The D/A converter 3 receives reference voltages and selects a reference voltage by a decoder formed by e.g. a ROM switch, not shown. The liquid crystal gray scale voltage generating circuit 4 includes e.g. a resistor ladder circuit, which are driven by voltage followers to decrease the impedance at each reference voltage point and to carry out fine adjustment of the reference voltage.

FIG. 6 is a diagram illustrating the configuration of a liquid crystal gray scale voltage generating circuit in which a resistor ladder circuit is driven by voltage followers (see Patent Documents 1 and 2). Referring to FIG. 6, the liquid crystal gray scale voltage generating circuit includes a resistor ladder circuit 10 (resistors R1, R2, . . . , Rn−2, and Rn−1), provided in an LCD driver, an external resistor ladder circuit 30 (resistors R1', R2', . . . , Rn−2', and Rn−1'), a buffer amplifier unit 20 which are made up by n voltage followers which receive respective tap voltages of the external resistor ladder circuit 30 to output reference voltages V1 to Vn, and a constant voltage generator (Vr) 40. The n voltage followers of the buffer amplifier unit 20 are composed by OP amps(operational amplifiers) OP1, OP2, . . . OPn−1, and Opn. The ladder resistors R1', R2', . . . , Rn−2', and Rn−1' of the external resistor ladder circuit 30 are variable resistors for performing the adjustment of the voltage values supplied to the OP amps OP1, OP2, . . . OPn−1, and OPn. The adjustment of the voltage values is performed so that they becomes optimal to the characteristic of the liquid crystal panel.

In the liquid crystal gray scale voltage generating circuit, shown in FIG. 6, the reference supply voltages are the ground voltage GND and Vr. This reference supply voltage Vr is supplied by a constant voltage source 40, such as band-gap-reference voltage generator, which is provided outside the gray scale voltage generating circuit. The gray scale voltages Vn, Vn−1, Vn−2, . . ., V2, and V1 are ultimately determined by the ladder resistors R0', R1', R2', . . . , Rn−2', and Rn−1'.

That is, $$Vn=Vr.$$

$$Vn-1=Vr\{(Rn-2'+Rn-3'+\ldots+R0')/(Rn-1'+Rn-2'+Rn-3'\ldots+R0')\}$$

$$V1=Vr\{R0'/(Rn-1'+Rn-2'+Rn-3'+\ldots+R0')\}$$

It is noted that, in case the resistance ratio of the ladder resistors R1, R2, . . . , Rn−2, and Rn−1, which are for internally determining the gray scale voltage, is equal to the resistance ratio of the ladder resistors R1', R2', . . . , Rn−2', and Rn−1', which are for externally determining the gray scale voltage, output currents of respective OP amps OP1, OP2, . . . and OPn−1 are zero.

However, the output current In of the n'th OP amp OPn, as counted from the GND side, is given in the source direction by the following equation (1):

$$In=(Vn-V1)/(R1+R2+\ldots+Rn-1)=Io \quad (1)$$

On the other hand, the output current I1 of the first OP amp OP1, as counted from the GND side, is given in the sink direction by the following equation (2):

$$I1=(Vn-V1)/(R1+R2+\ldots+Rn-1)=Io \quad (2)$$

Thus, there is a problem in the liquid crystal gray scale voltage generating circuit, shown in FIG. 6, that the output dynamic ranges of the OP amps OPn and OP1 are reduced due to the source output current In of the OP amp OPn and the sink output current I1 of the OP amp OP1, as indicated by the equations (1) and (2), respectively.

For solving the problem, the present Assignee has proposed the configuration shown in FIG. 7 or 8 in the Patent Document 2.

Specifically, an auxiliary resistor Rn is connected between a high voltage power supply terminal VDD and a ladder resistor Rn−1, whilst an auxiliary resistor R0 is connected between a low voltage power supply terminal GND and a ladder resistor R1, as shown in FIG. 7A. In other respects, the configuration is the same as that of FIG. 6. With the configuration of FIG. 7A, the source current of the voltage follower OPn on the high voltage power supply terminal VDD side is adjusted by the resistor Rn, whilst the sink current of the voltage follower OP1 on the low voltage power supply terminal GND side is adjusted by the resistor R0.

Auxiliary current sources I0 and In are provided in place of the auxiliary resistors R0 and Rn, respectively, as shown in FIG. 8A. It is noted that the auxiliary current sources I0 and In are set for satisfying the equations (1) and (2), respectively. With this circuit configuration, the source current and the sink current of the OP amps OPn and OP1 are made zero to enhance the output dynamic range, thereby facilitating the circuit design of the output stage in the OP amps.

[Patent Document 1]

JP Patent Kokai Publication No. JP-A-6-348235

[Patent Document 2]

JP Patent Kokai Publication No. JP-A-10-142582

SUMMARY OF THE DISCLOSURE

With the conventional LCD driver, the configuration shown in FIG. 7A is effective to enhance the output dynamic range to assure facilitated circuit design of output stage of the OP amps, as described above. However, in many cases, the connection of the ladder resistors in the routine LCD driver is not configured as shown in FIG. 7A or 8(A).

More specifically, the double-terminal resistor closest to a reference voltage of the liquid crystal panel (ordinarily VDD/2), termed COM, is usually not provided. That is, the n/2'th resistor is omitted.

In this case, assuming that the input voltage is V(n/2), the source current Io(n/2) of the n/2'th OP amp OPn/2 is given by the following expression (3):

$$Io(n/2)=V(n/2)/(R0+R1+\ldots+R(n/2-1)) \quad (3).$$

In similar manner, for the input voltage V(n/2+1), the sink current Io(n/2+1) of the n/2+1'st OP amp OPn/2+1 is given by the following expression (4):

$$Io(n/2+1)=\{VDD-V(n/2+1)\}/(R(n/2+1)+R(n/2+2)\ldots+Rn) \quad (4).$$

That is, even though there is no problem of the dynamic range, the output stage needs to be designed to accommodate high output current. Recently, many OP amps are composed by MOS transistors using for example a CMOS process. The MOS transistor has a mutual conductance (gm) smaller than that of the bipolar transistor, such that, if the driving capability is to be enhanced, the size of the MOS transistor is to be increased. Consequently, with a high driving current, the output stage transistor is increased in size, thus raising the cost.

The invention disclosed in the present application is arranged substantially as follows:

A gray scale voltage generating circuit of the present invention, is such a circuit for a display apparatus which employs positive and negative output voltages, polarities of said output voltages being defined with respect to a predetermine reference value, said gray scale voltage generating circuit comprising:

a first circuit having a plurality of terminals for outputting a plurality of positive gray scale voltages, respectively;

a second circuit having a plurality of terminals for generating a plurality of negative gray scale voltages, respectively;

a first current path between a highest voltage terminal of said first circuit and a positive power supply; and a second current path between a lowest voltage terminal of said second circuit and a negative power supply.

A gray scale voltage generating circuit in accordance with one aspect of the present invention, comprises: a first resistor ladder circuit for outputting first to n'th reference voltages from n nodes thereof, n being an even number, said n nodes being arranged between a high voltage power supply terminal and a low voltage power supply terminal;

a second resistor ladder circuit including n nodes arranged between an output terminal of a constant voltage generating circuit and said low voltage power supply terminal;

first to n'th voltage follower circuits respectively arranged between said n nodes of said second resistor ladder circuit and corresponding ones of said n nodes of said first resistor ladder circuit;

a first resistor connected between a n/2'th node as counted from the low voltage power supply terminal side of said first resistor ladder circuit and said high voltage power supply terminal; and a second resistor connected between a n/2+1'th node as counted from the low voltage power supply terminal side of said first resistor ladder circuit and said low voltage power supply terminal.

The gray scale voltage generating circuit according to the present invention preferably further comprises a third resistor connected between a n'th node as counted from said low voltage power supply terminal of said first resistor ladder circuit and said high voltage power supply terminal; and a fourth resistor connected between the first node as counted from said low voltage power supply terminal of said first resistor ladder circuit and said low voltage power supply terminal.

In the gray scale voltage generating circuit according another aspect of the present invention, first to fourth current sources may be substituted for the first to fourth resistors.

A voltage generating circuit in accordance with still another aspect of the present invention, comprises a resistor ladder circuit connected between a high voltage power supply terminal and a low voltage power supply terminal and adapted for generating a voltage higher than a predetermined reference value, and another resistor ladder circuit, adapted for generating a voltage lower than said predetermined reference value; wherein said resistor ladder circuit generating the voltage higher than said predetermined reference value comprises first and second current paths between a highest voltage terminal and said high voltage power supply terminal and between a lowest voltage terminal and said low voltage power supply terminal, respectively, each of said first and second current paths including a resistor or a current source; and said another resistor ladder circuit generating the voltage lower than said certain reference value comprises third and fourth current paths between said highest voltage terminal and said high voltage power supply terminal and between said lowest voltage terminal and said low voltage power supply terminal, respectively, each of said third and fourth current paths including a resistor or a current source. In the present invention, a resistor is not provided between said lowest voltage terminal of said resistor ladder circuit generating the voltage higher than said reference value and said highest voltage terminal of said another resistor ladder circuit generating the voltage lower than said reference value.

The meritorious effects of the present invention are summarized as follows.

According to the present invention, contribution may be made to more facilitated circuit design of an output stage in the design of a CMOS amplifier which constitutes a buffer amplifier provided in an LCD driver.

According to the present invention, even when the buffer amplifier is mounted externally, the driving capability of the externally mounted buffer amplifier is unneeded, thus assuring facilitated designing.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
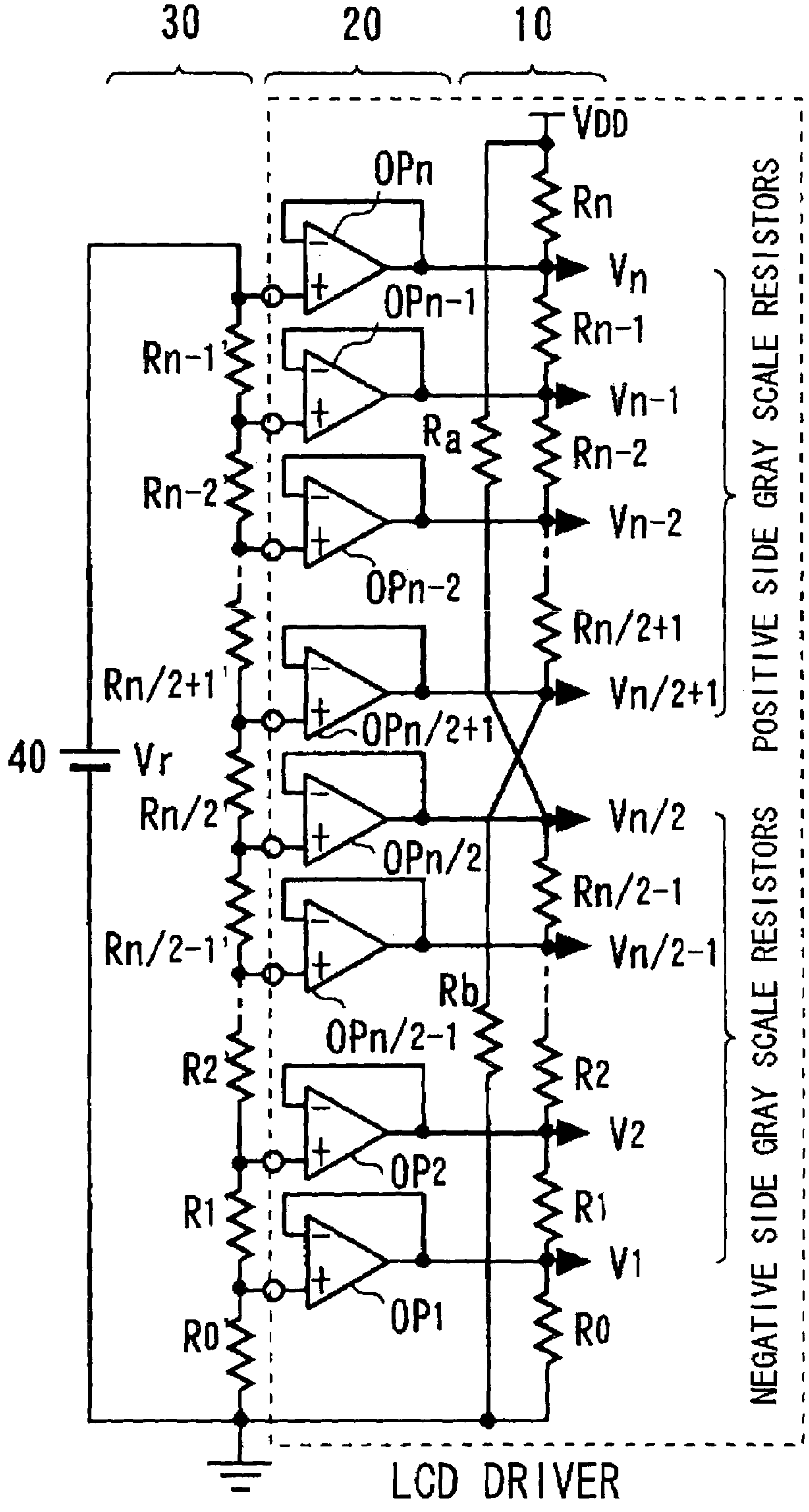
FIG. 1 is a diagram illustrating the configuration of a first embodiment of the present invention.

The embodiment mode of carrying out the present invention will be described with reference to the accompanying drawings. Referring to FIG. 1, a first resister network circuit (Rn to Rn/2+1) which is for generating n/2 positive gray scale voltages, includes a current path (a resistor Rn or a current source I1) between the highest voltage terminal (Vn) of the first resistor network circuit and a positive power supply (VDD) and a current path (resistor Rb or current source I4) between the lowest voltage terminal (Vn/2+1) of the first resistor network circuit and a negative power supply (GND). A second resistor network circuit (Rn/2−1 to R0) which is for generating n/2 negative gray scale voltages, includes a current path (resistor Ra or current source I3) between the highest voltage terminal (Vn/2) of the second resistor network circuit and the positive power supply (VDD) and a current path (resistor R0 or current source I2) between the lowest voltage terminal (V1) of the second resistor network circuit and the negative power supply (GND). As shown in FIG. 1, the auxiliary resistors Rn and R0 are connected between the positive power supply terminal (VDD) and the ladder resistor Rn−1 and between the negative power supply terminal (GND) and the ladder resistor R1, respectively, and the auxiliary resistors Ra and Rb are connected between the positive power supply (VDD) and the ladder resistor R(n/2−1) and between the negative power supply (GND) and the ladder resistor R(n/2+1), respectively. As a result, the output currents of all OP amps OP1-OPn may be set to zero. Alternatively, constant current sources I1, I2, I3 and I4 may be provided in place of the auxiliary resistors R0, Rn, Ra and Rb to attain the same effect.

FIG. 1 is a diagram showing an equivalent circuit of a ladder resistor part provided in an LCD driver according to an embodiment of the present invention. Referring to FIG. 1, the ladder resistor part includes a ladder resistor circuit 10 (resistors R0, R1, R2, . . . , Rn/2−1, Rn2+1, . . . , Rn−2, Rn−1, and Rn), provided in the LCD device, an external resistor ladder circuit 30 (resistors R0', R1', R2', . . . , Rn/2−1', Rn/2', Rn/2+1', . . . , Rn−2', and Rn−1'), connected between the output voltage (Vr) of the constant voltage generator 40 and the low voltage power supply terminal (GND), and a buffer amplifier unit 20, which includes n voltage followers (OPn, OPn−1, . . . , and OP1). The ladder resistor circuit 10 is connected between the high voltage power supply terminal (VDD) and the low voltage power supply terminal (GND) and has respective nodes (taps) generating reference voltages (Vn, Vn−1, Vn/2+1, Vn/2−1, . . . , and V1). The n voltage followers have inputs connected to one ends of respective nodes of the external resistor ladder circuit 30 (resistors Rn−1', Rn−2', . . . , Rn/2+1', Rn/2', Rn2−1', R1', R0') and have outputs to respective nodes of the ladder circuit 10 provided in the LCD driver (one ends of the resistors Rn, Rn−1, Rn/2+1, Rn2−1, . . . , R2, R1). A first resistor (Ra) is connected between the node voltage Vn/2 and the high voltage power supply terminal (VDD), whilst a second resistor (Rb) is connected between the node voltage Vn/2+1 and the low voltage picture signals terminal (GND).

Figure 2:
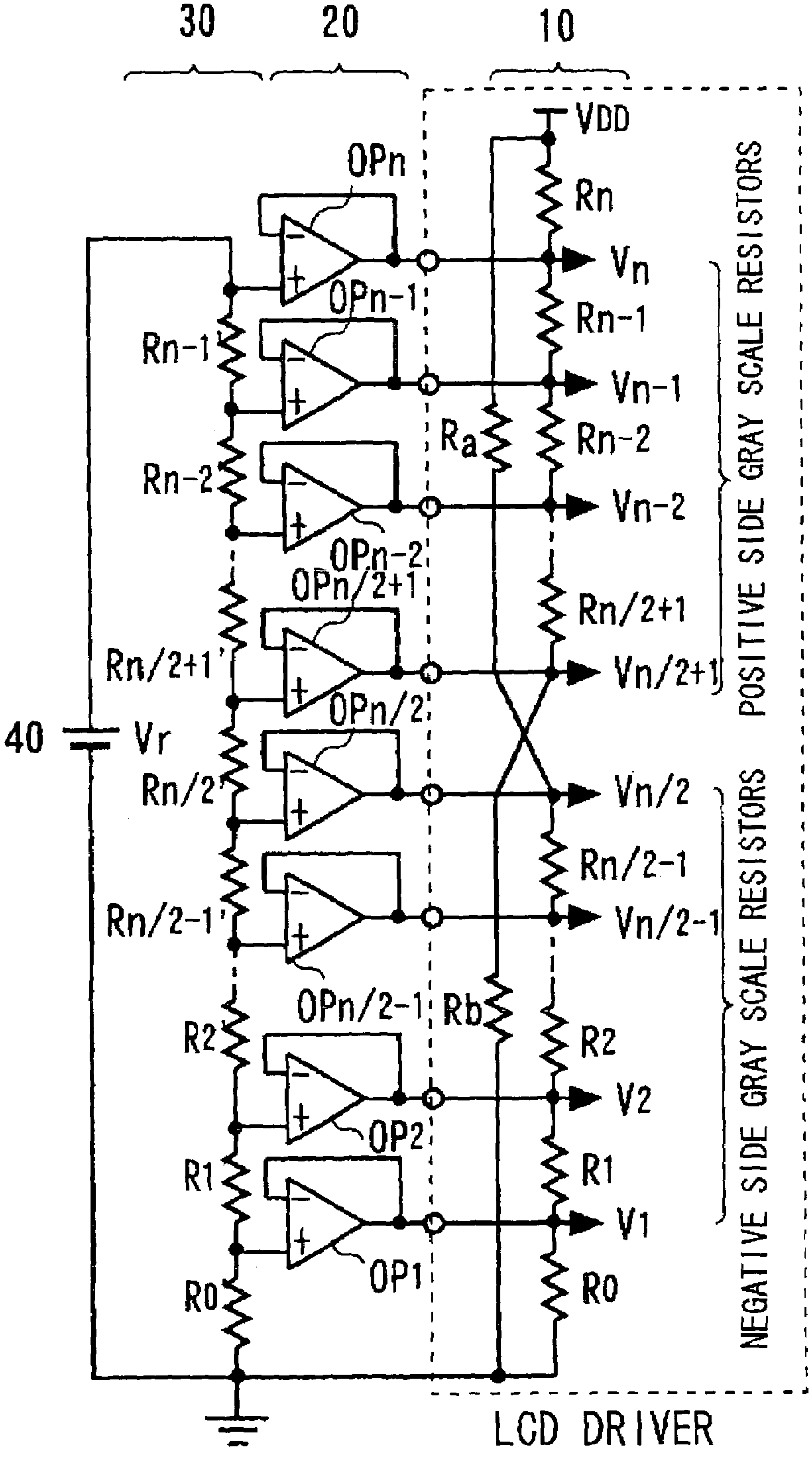
FIG. 2 is a diagram illustrating the configuration of a modification of the first embodiment of the present invention.

In the configuration shown in FIG. 1, the buffer amplifier unit 20 (OP amps OP1 to OPn) is provided in the LCD driver. However, as a matter of course, the present invention is not to be limited to this configuration. For example, in the configuration shown in FIG. 2, the buffer amplifier unit 20 (OP amps OP1 to OPn) are provided outside the LCD driver.

A gray scale power supply circuit according to an embodiment of the present invention will now be described. The current flowing through an OP amp is assisted by the resistor or a current source outside the OP amp to aid in the current output from the OP amp. The output current capability of the OP amp may be reduced to diminish the chip size.

Figure 7A:
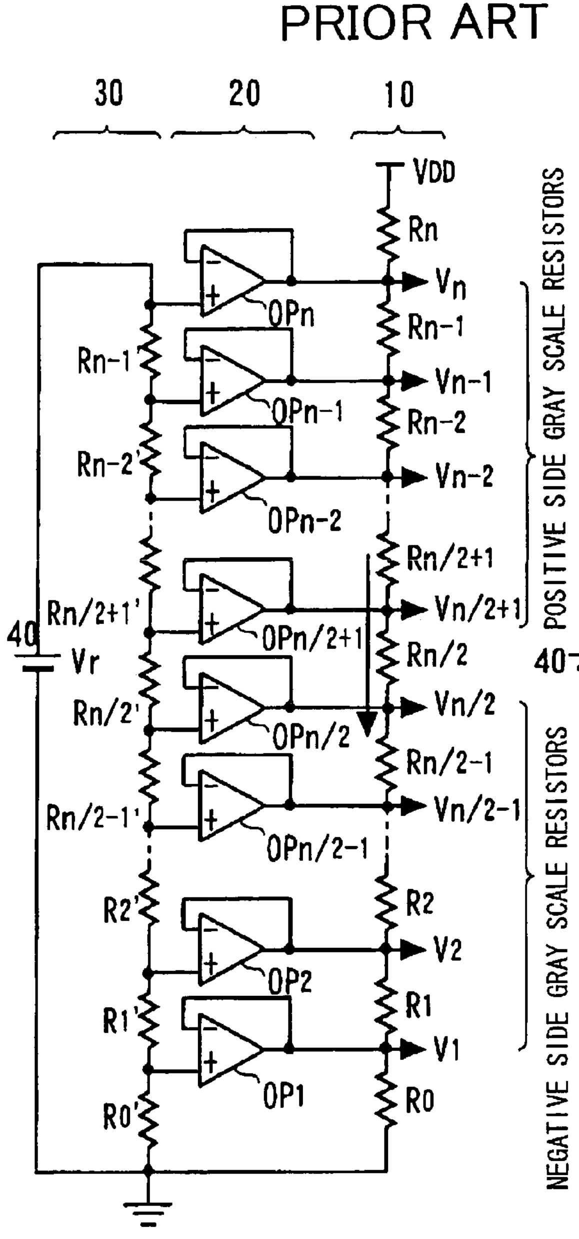
FIG . 7A PRIOR ART
FIGS. 7A and 7B show another configurations of a conventional liquid crystal gray scale voltage generating circuit.
Figure 7B:
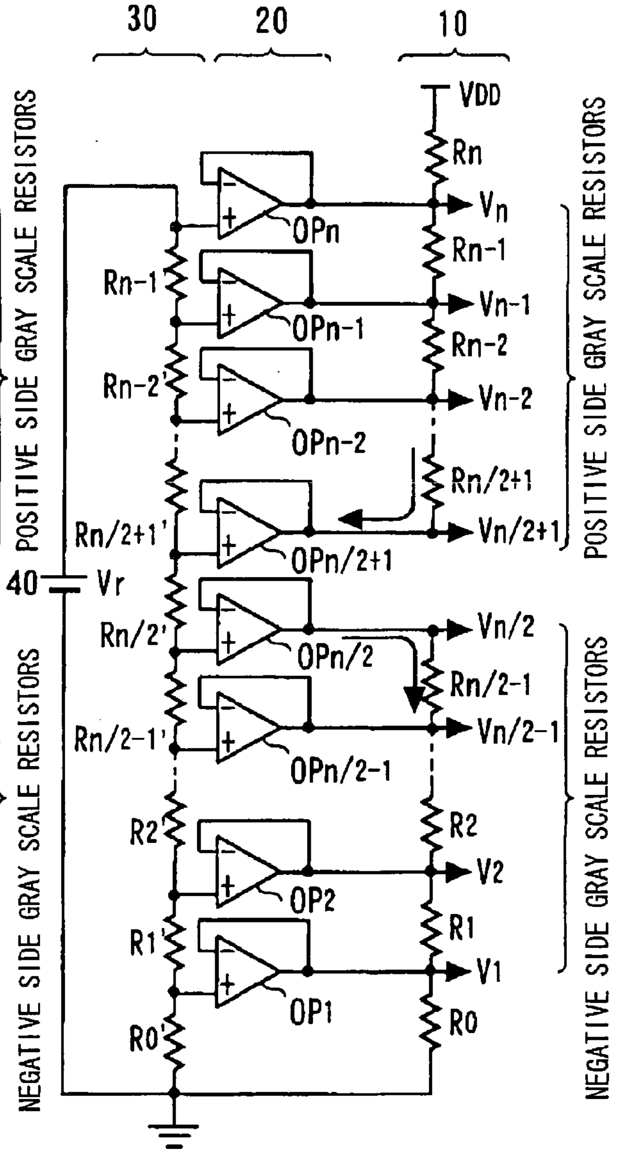
FIG . 7B PRIOR ART
Figure 8A:
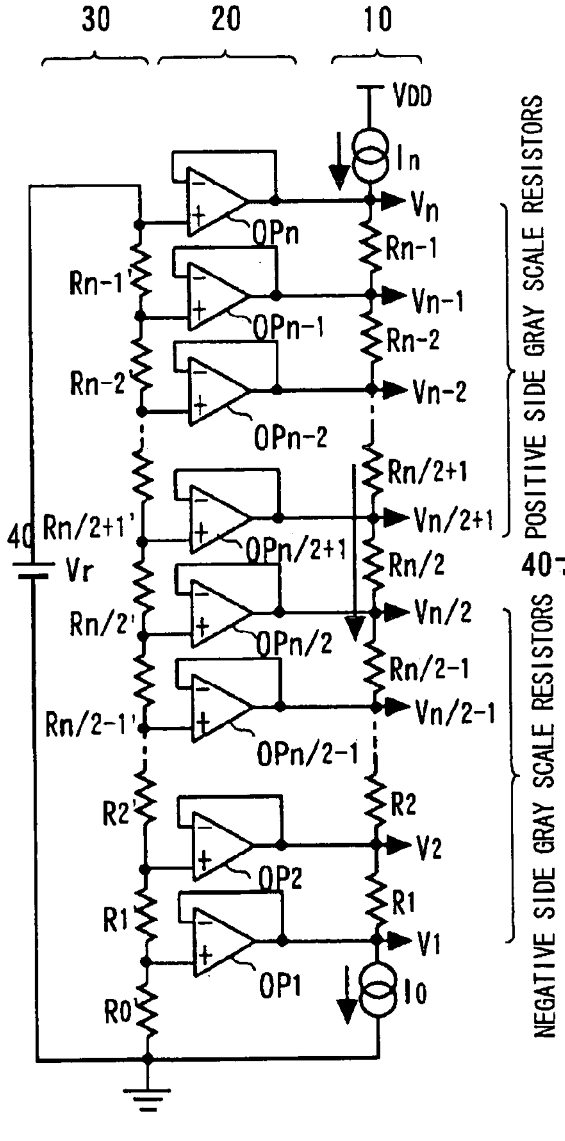
FIG. 8A PRIOR ART
FIGS. 8A and 8B show further configurations of a conventional liquid crystal gray scale voltage generating circuit.
Figure 8B:
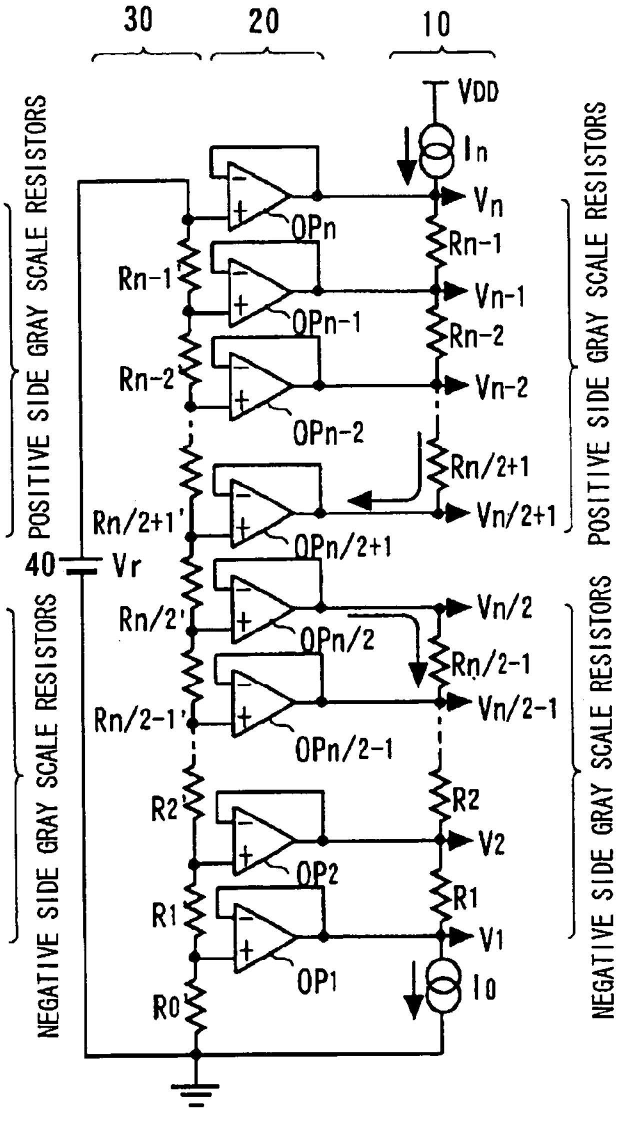
FIG. 8B PRIOR ART

In the configuration of FIGS. 7(B) and 8(B), as comparative cases, there lacks the current path for assisting the driving currents of the OP amps OPn/2−1 and OPn/2. Hence, the current capability conforming to the resistance values of the resistor ladder is needed for these two OP amps OPn/2−1 and OPn/2 to render the design thereof difficult.

Referring to FIG. 1, the operation of the present embodiment will now be described. If, in the present embodiment, the resistance value of the resistor Ra is set so that the output current Io(n/2) of the OP amp OPn/2 will satisfy the following equation (5), the output current of the OP amp OPn/2 is zero.

$$Io(n/2)=V(n/2)/(R0+R1+\ldots+R(n/2-1))=(VDD-V(n/2))/Ra \quad (5)$$

In similar manner, if the resistance of the resistor Rb is set so that the output current Io(n/2+1) of the OP amp OPn/2+1 will satisfy the following equation (6), the output current of the OP amp OPn/2+1 is zero.

$$Io(n/2+1)=(VDD-V(n/2+1))/(R(n/2+1)+R(n/2+2)+\ldots+Rn)=V(n/2+1)/Rb \quad (6)$$

If the resistors R0 and Rn are set to satisfy the following equations (7) and (8), respectively, the output currents of the OP amps OPn and OP1 are also zero.

$$(Vn-Vn/2+1)/(Rn/2+1+Rn/2+2+\ldots+R(n-1))=(VDD-Vn)/Rn \quad (7)$$

$$(Vn/2-V1)/(R1+R2+\ldots+R(n/2-1))=V1/R0 \quad (8)$$

Figure 3:
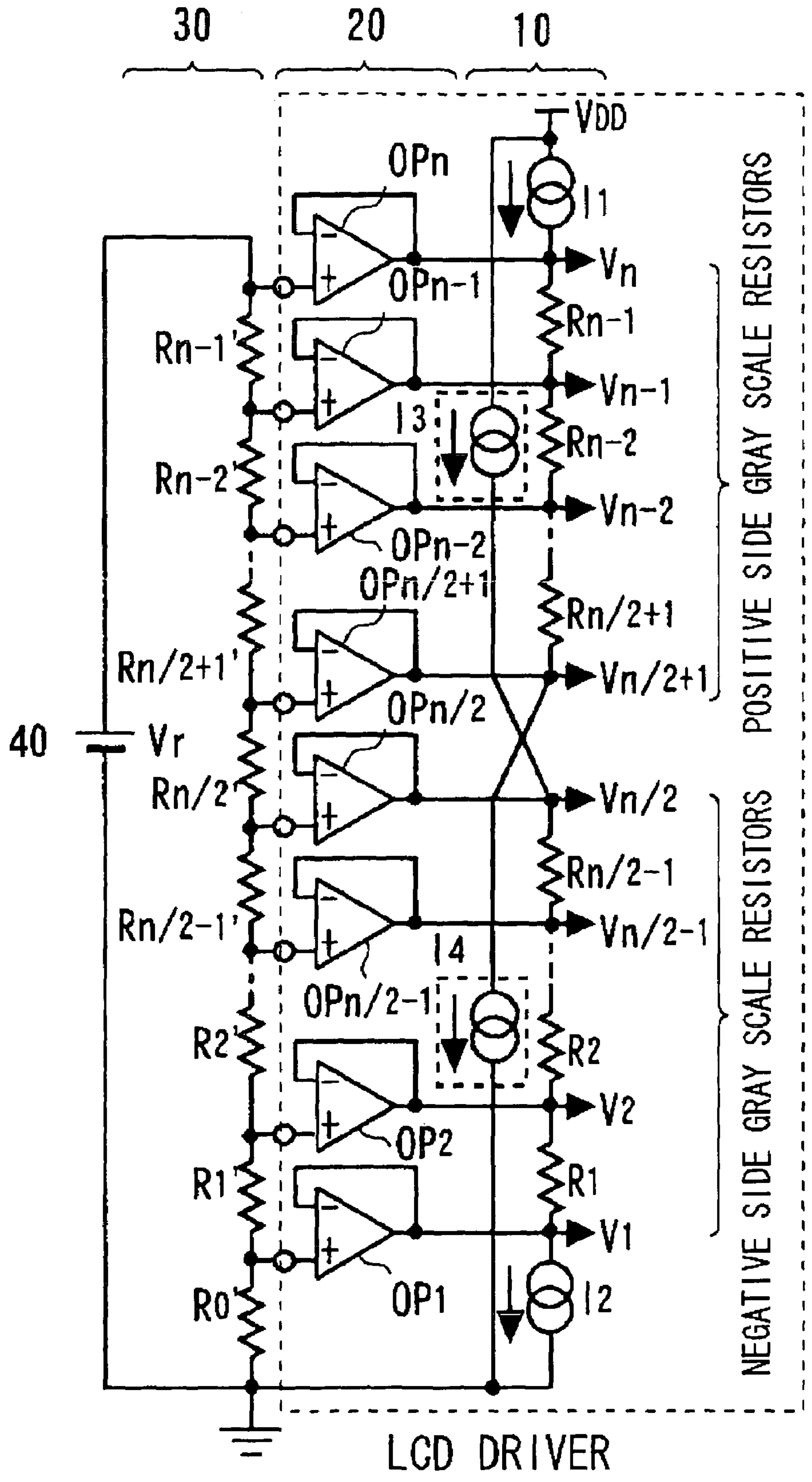
FIG. 3 is a diagram illustrating the configuration of a second embodiment of the present invention.
Figure 4:
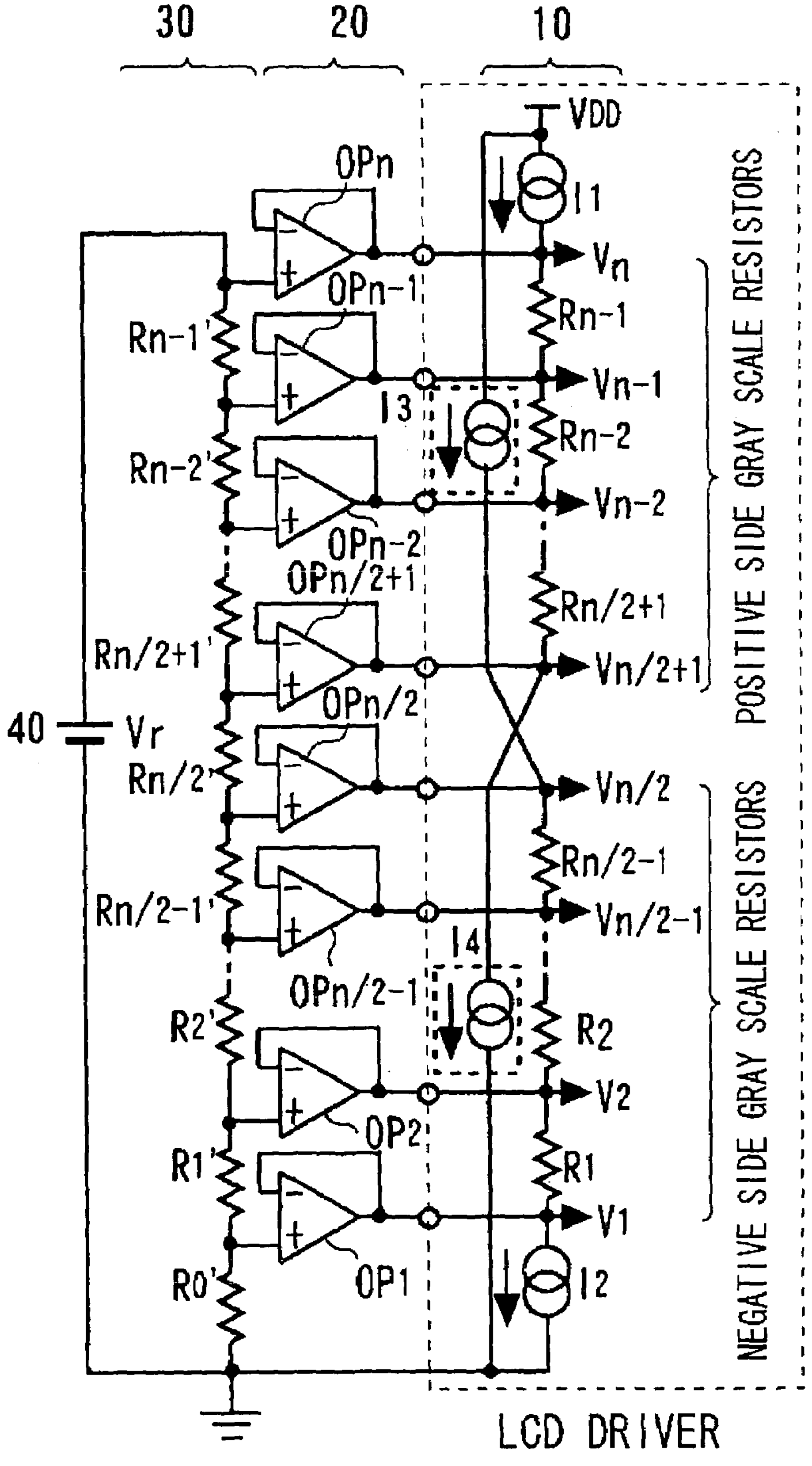
FIG. 4 is a diagram illustrating the configuration of a modification of the second embodiment of the present invention.
Figure 5:
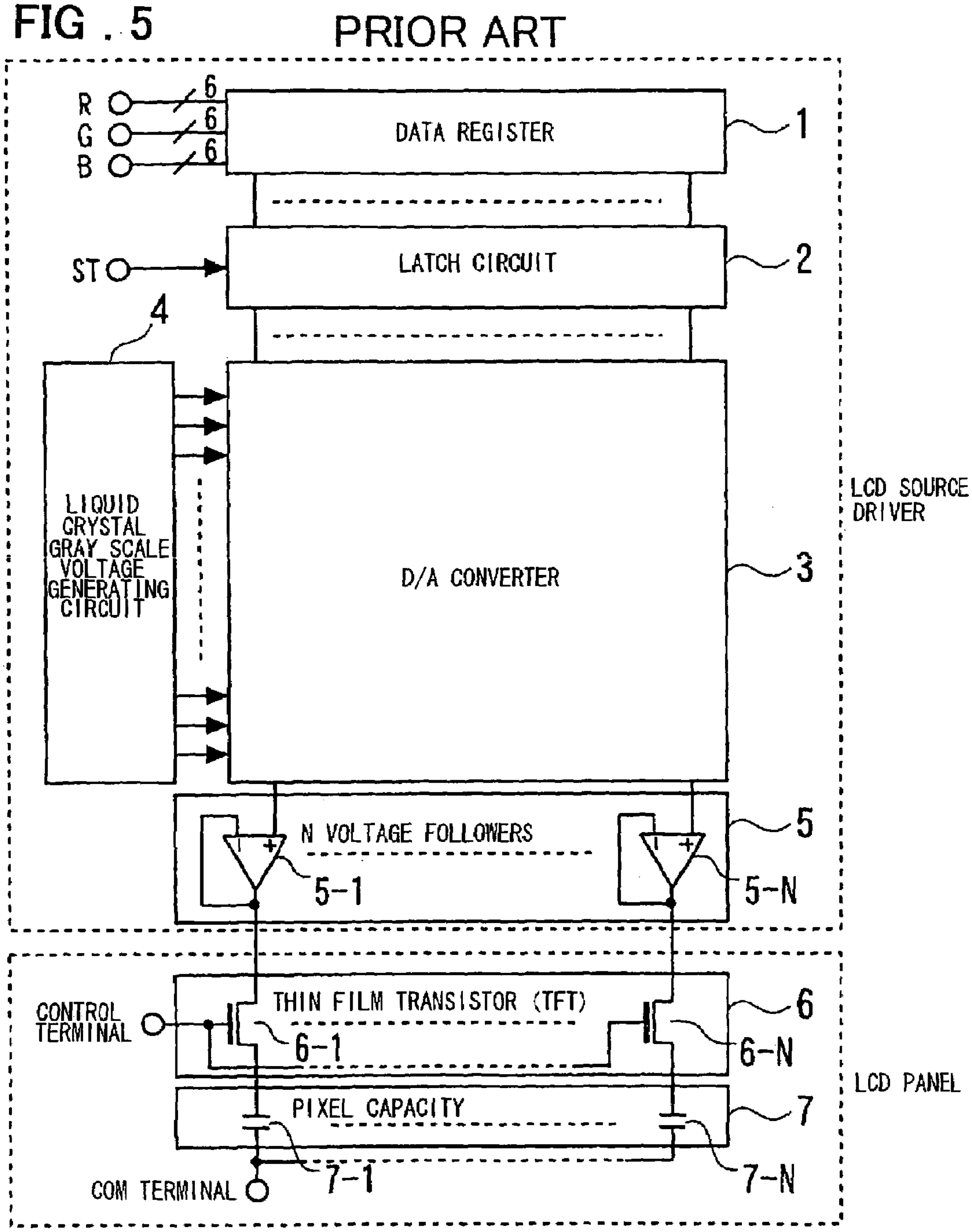
FIG . 5 PRIOR ART
FIG. 5 is a diagram illustrating the configuration of a typical example of a liquid crystal display device.
Figure 6:
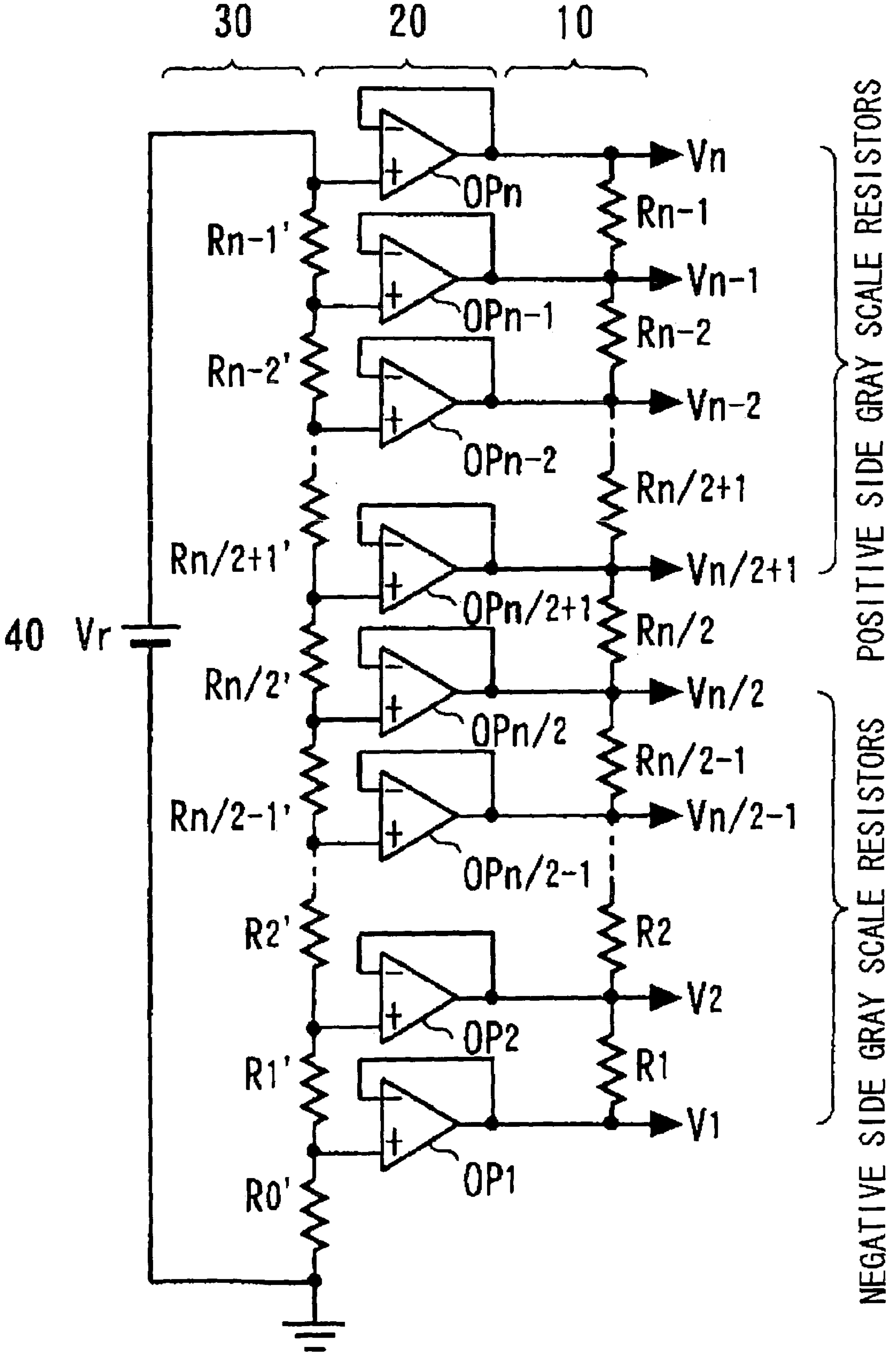
FIG . 6 PRIOR ART
FIG. 6 is a diagram illustrating the configuration of a conventional liquid crystal gray scale voltage generating circuit.

A second embodiment of the present invention will now be described. FIG. 3 is a diagram illustrating the configuration of the second embodiment of the present invention. A resistor ladder circuit, provided in the LVD driver circuit, includes resistors R1, R2, . . . , n/2−1, Rn/2+1, . . . , Rn−2, and Rn−1, connected in series. The resistor adder circuit also includes a constant current source I1 and a constant current source 12 connected between the resistor Rn-1 and the VDD and between the resistor R1 and the GND, respectively. A third constant current source I3 is connected between the node voltage Vn/2 and the high voltage power supply terminal (VDD), whilst a fourth constant current source I4 is connected between the node voltage Vn/2+1 and the low voltage power supply terminal (GND).

In the present embodiment, a constant current source is substituted for the resistor bias in FIG. 1.

If, in the present embodiment, the current value of the constant current source I3 is set so that the output current Io(n/2) of the OP amp OPn/2 will satisfy the following equation (9), the output current of the OPn/2 is zero.

$$Io(n/2)=(V(n/2)-V1)/(R0+R1+\ldots+R(n/2-1))=I3 \quad (9)$$

In similar manner, if the current value of the constant current source I4 is set so that the output current Io(n/2+1) of the OP amp OPn/2+1 will satisfy the following equation (10), the output current of the OPn/2+1 is zero.

$$Io(n/2+1)=(Vn-V(n/2+1))/(R(n/2+1)+R(n/2+2)+\ldots+Rn-1)=I4 \quad (10)$$

If the current values of the constant current sources I1 and 12 are set for satisfying the following equations (11) and (12), respectively, the output currents of the OP amps OPn and OP1 are also zero.

$$(Vn-Vn/2+1)/(Rn/2+1+Rn/2+2+\ldots+R(n-1))=I1 \quad (11)$$

$$(Vn/2-V1)/(R1+R2+\ldots+R(n/2-1))=I2 \quad (12)$$

It is noted however that the output currents of the respective OP amps are zero when the resistance ratio state of the external ladder resistors is equal to the resistance ratio state of the ladder resistors provided in the LCD driver. If the ratio states are changed, the current is slightly changed concomitantly. The auxiliary resistors or the auxiliary currents, if used, are effective to reduce the output current significantly with sufficient favorable effects.

In the embodiment shown in FIG. 3, the buffer amplifiers (OP amps) are provided in the LCD driver. Alternatively, the buffer amplifiers (OP amps) may be provided outside the LCD driver.

Although preferred embodiments of the present invention have been explained in the foregoing, it is noted that the present invention is not limited to the configuration illustrated, but rather may encompass various modifications or corrections that may readily occur to those skilled in the art without departing from the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A gray scale voltage generating circuit comprising:

a first resistor ladder circuit for outputting first to n'th reference voltages from n nodes thereof, n being an even number, said n nodes being arranged between a high voltage power supply terminal and a low voltage power supply terminal;

a second resistor ladder circuit including n nodes arranged between an output terminal of a constant voltage generating circuit and said low voltage power supply terminal;

first to n'th voltage follower circuits respectively arranged between said n nodes of said second resistor ladder circuit and corresponding ones of said n nodes of said first resistor ladder circuit;

a first resistor connected between a n/2'th node as counted from the low voltage power supply terminal side of said first resistor ladder circuit and said high voltage power supply terminal; and a second resistor connected between a n/2+1'th node as counted from the low voltage power supply terminal side of said first resistor ladder circuit and said low voltage power supply terminal.

2. The gray scale voltage generating circuit according to claim 1 further comprising:

a third resistor connected between a n'th node as counted from said low voltage power supply terminal of said first resistor ladder circuit and said high voltage power supply terminal; and a fourth resistor connected between the first node as counted from said low voltage power supply terminal of said first resistor ladder circuit and said low voltage power supply terminal.

3. The gray scale voltage generating circuit according to claim 1, wherein, in said first resistor ladder circuit, said n/2'th node and said n/2+1'th node are not connected via a resistor.

4. A display apparatus including a driver, said driver comprising:

the gray scale voltage generating circuit as set fourth in claim 1; and a digital-to-analog converter receiving output voltages from said gray scale voltage generating circuit and outputting a signal voltage corresponding to an input digital data signal;

wherein said first resistor ladder circuit and the voltage follower circuits of the gray scale voltage generating circuit is provided in said driver and said second resistor ladder circuit of the gray scale voltage generating circuit is provided outside said driver.

5. A display apparatus including a driver, said driver comprising:

the gray scale voltage generating circuit as set fourth in claim 1; and a digital-to-analog converter receiving output voltages from said gray scale voltage generating circuit and outputting a signal voltage corresponding to an input digital data signal;

wherein said first resistor ladder circuit of the gray scale voltage generating circuit is provided in said driver; and said voltage follower circuits and said second resistor ladder circuit are provided outside said driver.

6. A gray scale voltage generating circuit comprising:

a first resistor ladder circuit for outputting first to n'th reference voltages from n nodes thereof, n being an even number, said n nodes being arranged between a high voltage power supply terminal and a low voltage power supply terminal;

a second resistor ladder circuit including n nodes arranged between an output terminal of a constant voltage generating circuit and said low voltage power supply terminal;

first to n'th voltage follower circuits arranged between n nodes of said second resistor ladder circuit and corresponding n nodes of said first resistor ladder circuit;

a first current source arranged between a n/2'th node of said first resistor ladder circuit as counted from the low voltage power supply terminal side and said high voltage power supply terminal; and a second current source arranged between a n/2+1'th node of said first resistor ladder circuit as counted from the low voltage power supply terminal side of said first resistor ladder circuit and said low voltage power supply terminal.

7. The gray scale voltage generating circuit according to claim 6 further comprising:

a third current source connected between a n'th node as counted from the low voltage power supply terminal side of said first resistor ladder circuit and said high voltage power supply terminal; and a fourth current source connected between the first node as counted from the low voltage power supply terminal side of said first resistor ladder circuit and said low voltage power supply terminal.

8. A display apparatus including a driver, said driver comprising:

the gray scale voltage generating circuit as set fourth in claim 6; and a digital-to-analog converter receiving output voltages from said gray scale voltage generating circuit and outputting a signal voltage corresponding to an input digital data signal;

wherein said first resistor ladder circuit and the voltage follower circuits of the gray scale voltage generating circuit is provided in said driver and said second resistor ladder circuit of the gray scale voltage generating circuit is provided outside said driver.

9. A display apparatus including a driver, said driver comprising:

the gray scale voltage generating circuit as set fourth in claim 6; and a digital-to-analog converter receiving output voltages from said gray scale voltage generating circuit and outputting a signal voltage corresponding to an input digital data signal;

wherein said first resistor ladder circuit of the gray scale voltage generating circuit is provided in said driver; and said voltage follower circuits and said second resistor ladder circuit are provided outside said driver.

* * * * *